US012732182B2

(12) United States Patent
Lien et al.

(10) Patent No.: US 12,732,182 B2
(45) Date of Patent: Sep. 8, 2026

(54) INTEGRATED CIRCUIT AND METHOD OF OPERATING THE SAME

(71) Applicant: TAIWAN SEMICONDUCTOR MANUFACTURING COMPANY, LTD., Hsinchu (TW)

(72) Inventors: Bei-Shing Lien, Hsinchu (TW); Szu-Lin Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/756,120

(22) Filed: Jun. 27, 2024

(65) Prior Publication Data

US 2025/0286549 A1 Sep. 11, 2025

Related U.S. Application Data

(60) Provisional application No. 63/562,466, filed on Mar. 7, 2024.

(51) Int. Cl.
*H03K 17/14* (2006.01)

(52) U.S. Cl.
CPC .................................. *H03K 17/145* (2013.01)

(58) Field of Classification Search
CPC .................................................... H03K 17/145
See application file for complete search history.

(56) References Cited

U.S. PATENT DOCUMENTS

| | | | | |
|---|---|---|---|---|
| 7,902,912 | B2 * | 3/2011 | Marinca | G05F 3/30 327/539 |
| 9,383,760 | B2 * | 7/2016 | Porras | G05F 1/468 |
| 2014/0161149 | A1 | 6/2014 | Susak et al. | |
| 2022/0223579 | A1 * | 7/2022 | Chang | H03K 17/102 |
| 2022/0357759 | A1 * | 11/2022 | Kundu | G05F 1/468 |

FOREIGN PATENT DOCUMENTS

| | | |
|---|---|---|
| TW | 200629029 | 8/2006 |
| TW | I340540 | 4/2011 |

* cited by examiner

*Primary Examiner* — Menatoallah Youssef
*Assistant Examiner* — Colleen J O Toole
(74) *Attorney, Agent, or Firm* — Hauptman Ham, LLP

(57) ABSTRACT

An integrated circuit is provided, which includes a first temperature-sensitive device and a second temperature-sensitive device. The first temperature-sensitive device is configured to generate a first bias current which monotonically increases in accordance with an absolute temperature, and generate a first voltage based on the first bias current. The second temperature-sensitive device is configured to generate a second voltage across the second temperature-sensitive device, and output a reference voltage at an output terminal of the integrated circuit. The second voltage monotonically decreases in accordance with the absolute temperature. The reference voltage equals the first voltage plus the second voltage.

20 Claims, 11 Drawing Sheets

INTEGRATED CIRCUIT AND METHOD OF OPERATING THE SAME

CROSS-REFERENCE TO RELATED APPLICATION(S)

This application claims the benefit of U.S. Provisional Application No. 63/562,466, filed Mar. 7, 2024, the entire disclosure of which is incorporated by reference herein.

BACKGROUND

The current trend in miniaturizing integrated circuits (ICs) has led to the development of smaller, more efficient devices with increased functionality and higher operating speeds. This miniaturization process has also brought about more stringent design and manufacturing requirements, as well as reliability challenges. Electronic design automation (EDA) tools are utilized to create, optimize, and validate standard cell layout designs for integrated circuits, ensuring that they meet both design and manufacturing specifications.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features can be arbitrarily increased or reduced for clarity of discussion.

DETAILED DESCRIPTION

Figure 1A:
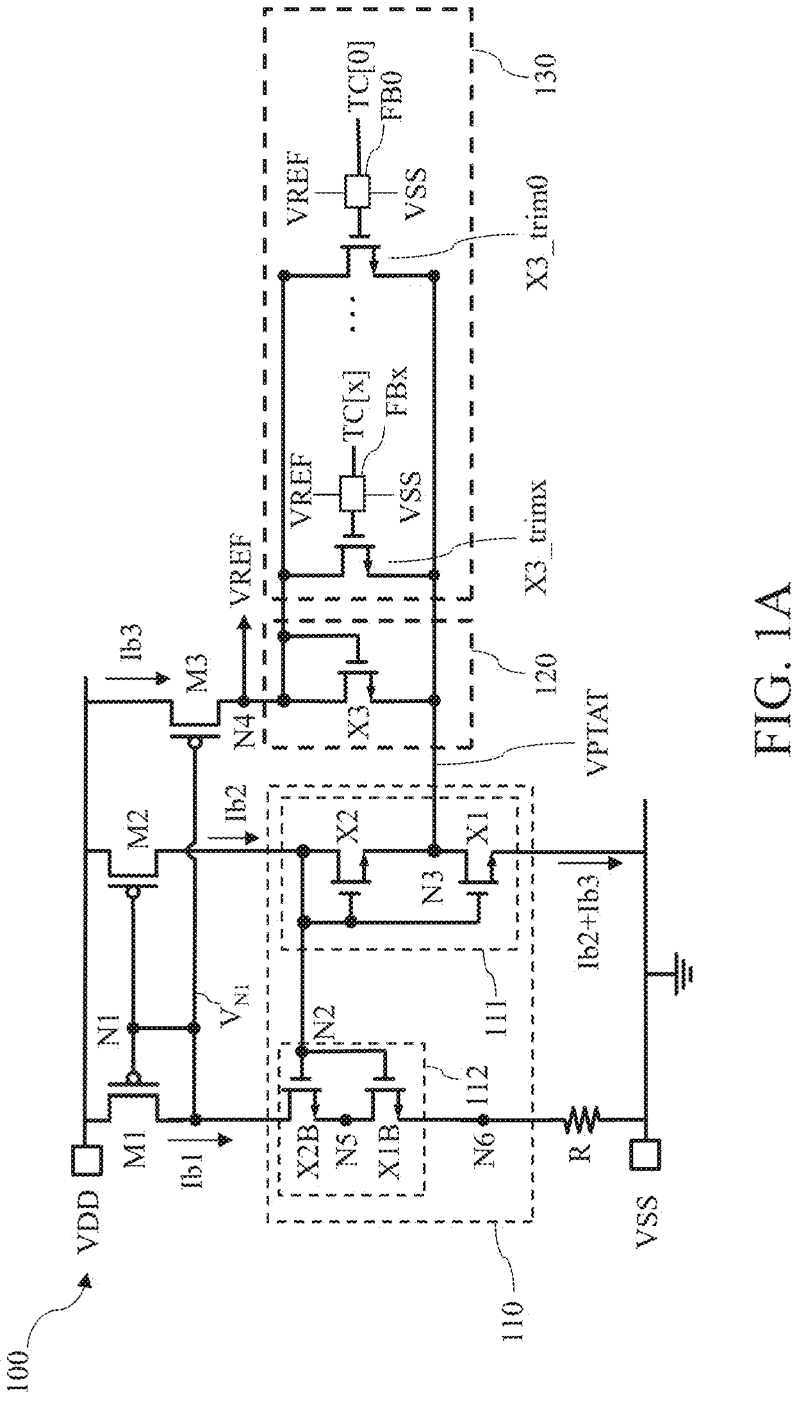
FIG. 1A is a schematic diagram of a voltage reference circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, it will be understood that when an element is referred to as being "connected to" or "coupled to" another element, it can be directly connected to or coupled to the other element, or intervening elements can be present.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device can be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

In some embodiments, a voltage reference circuit is implemented to generate a reference voltage using stacked gate devices. A stacked gate device includes a plurality of field-effect transistors having a common gate terminal, and having channels connected in series. A first temperature-sensitive device is implemented based on stacked gate devices to generate a first bias current which monotonically increases with an absolute temperature of the voltage reference circuit, and to generate a first voltage based on the first bias current. A second temperature-sensitive device is implemented based on the stacked gate devices to generate a second voltage, which monotonically decreases with the absolute temperature of the voltage reference circuit, across the second temperature-sensitive device. The temperature dependency of the reference voltage generated by the voltage reference circuit can be compensated using the first voltage generated by the first temperature-sensitive device and the second voltage generated by the second temperature-sensitive device.

Figure 1C:
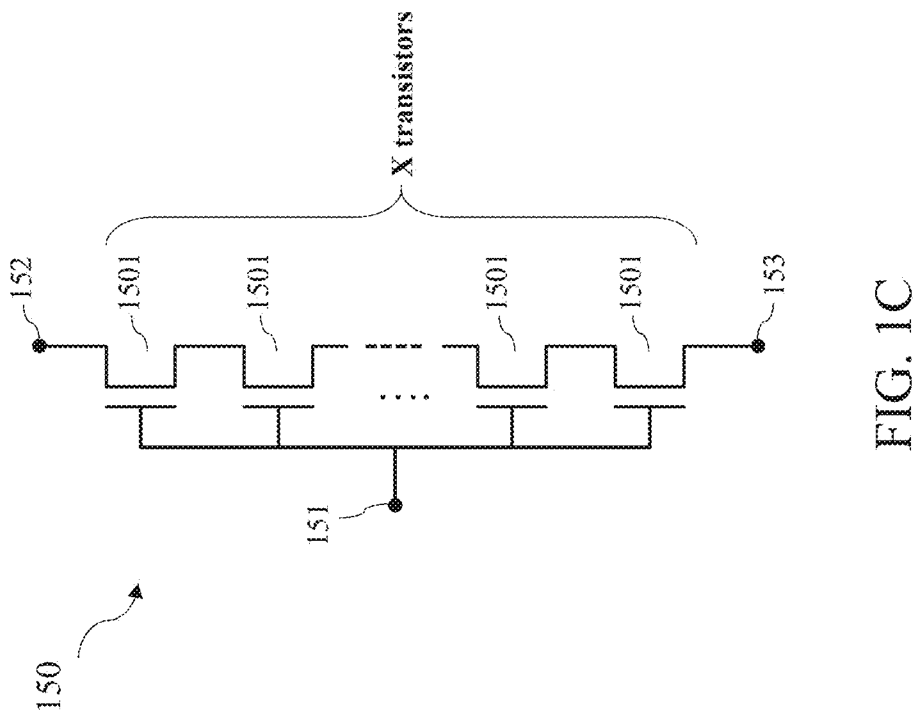
FIG. 1C is an equivalent circuit diagram of the stacked gate device in FIG. 1B in accordance with some embodiments of the present disclosure.
Figure 1B:
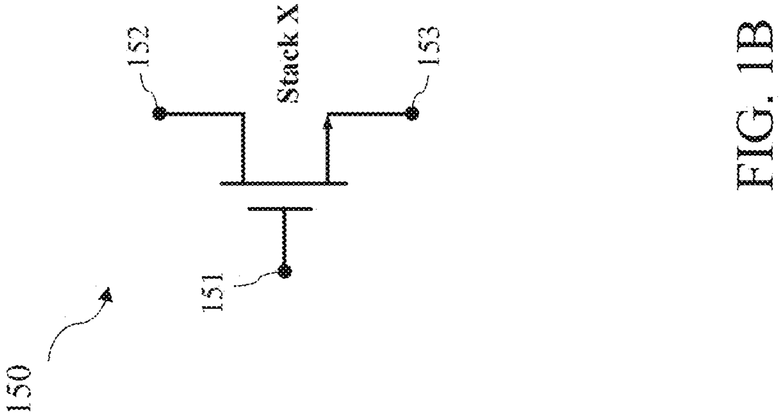
FIG. 1B is a diagram of a stacked gate device in accordance with some embodiments of the present disclosure.

FIG. 1A is a schematic diagram of a voltage reference circuit in accordance with some embodiments of the present disclosure. FIG. 1B is a diagram of a stacked gate device in accordance with some embodiments of the present disclosure. FIG. 1C is an equivalent circuit diagram of the stacked gate device in FIG. 1B in accordance with some embodiments of the present disclosure.

In some embodiments, the voltage reference circuit 100 is a bandgap voltage reference circuit which is configured to provide a reference voltage VREF. In some embodiments, the reference voltage VREF is equal to supply voltage VDD. In some embodiments, the reference voltage VREF is equal to a voltage between the supply voltage VDD and the reference voltage VSS. The voltage reference circuit 100 may include transistors M1, M2 and M3, temperature-sensitive devices 110 and 120, and a trimming circuit 130, as depicted in FIG. 1A. The transistors M1, M2 and M3 may be field-effect transistors (FETs). Each of the transistors M1, M2 and M3 has a gate terminal and a channel between a source/drain (S/D) terminal and a S/D terminal. The current passing through the channel depends on the voltage difference applied to the gate terminal of each of transistor M1, M2 and M3.

The voltage reference circuit 100 includes stacked gate devices X1, X2, X3, X1B, X2B, and X3_trim0 to X3_trimx where x is an integer corresponding to the number of stacked gate trim devices. Each of the stacked gate devices X1, X2, X3, X1B, and X2B includes a plurality of field-effect transistors (i.e., referred as "transistors" hereafter) stacked together. The references X1, X2, X3, X1B and X2B are also used to represent the number of FETs in each of the respective stacked gate devices X1, X2, X3, X1B and X2B. In some embodiments, each of the stacked gate devices X3_trim0 to X3_trimx have the same number of stacked transistors as the stacked gate device X3, but the number of finger structures of the stacked gate devices X3_trim0 to X3_trimx may differ from that of the stacked gate device X3. The details of a stacked gate device are described as follows.

In some embodiments, a stacked gate device 150, also known as "stack X" in FIG. 1B, is a three-terminal transistor device with a gate terminal 151, a S/D terminal 152, and a S/D terminal 153. The equivalent circuit diagram of the stacked gate device 150 includes a plurality of transistors 1501 arranged in a cascode structure or a stacked structure, as shown in FIG. 1C. The total number of stacked transistors 1501 is denoted as an integer X. For example, the gate terminals of the transistors 1501 are connected together to form the gate terminal 151 of the stacked gate device 150. Additionally, the transistors 1501 may be N-type FETs, and the N-type channels of the transistors 1501 (e.g., X transistors 1501) are connected in series between the S/D terminal 152 and the S/D terminal 153 of the stacked gate device 150. For example, the S/D terminal of the first transistor 1501 serves as the S/D terminal 152 of the stacked gate device 150, and a S/D terminal of the first transistor 1501 is connected to a S/D terminal of the second transistor 1501, a S/D terminal of the second transistor 1501 is connected to a S/D terminal of the third transistor 1501, . . . , and so on. In other words, for each integer n between 1 to X−1, the S/D terminal of the n-th transistor 1501 is connected to the S/D terminal of the (n+1)-th transistor 1501. Accordingly, the S/D terminal of the last transistor 1501 (i.e., X-th transistor 1501) serves as the S/D terminal 153 of the stacked gate device 150.

Figure 1E:
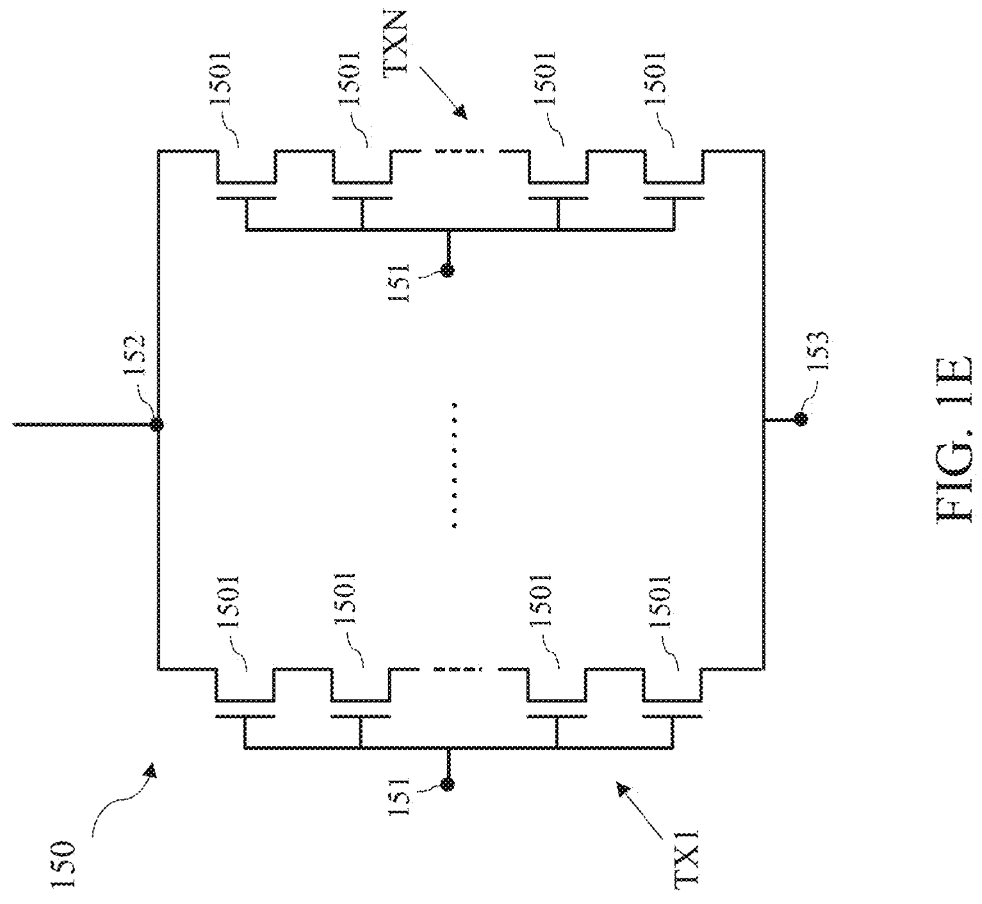
FIG. 1E is an equivalent circuit diagram of the stacked gate device in FIG. 1D in accordance with some embodiments of the present disclosure.
Figure 1D:
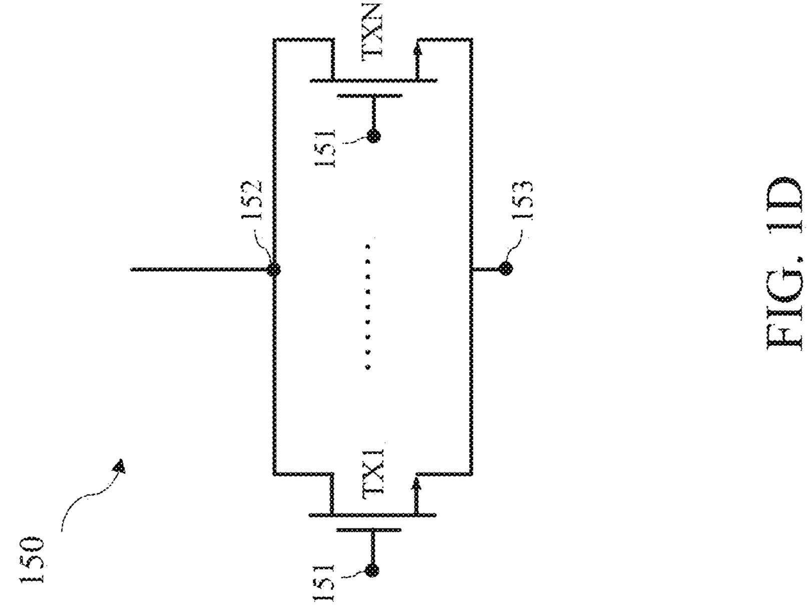
FIG. 1D is a diagram of a stacked gate device with multiple finger structures in accordance with some embodiments of the present disclosure.

FIG. 1D is a diagram of a stacked gate device with multiple finger structures in accordance with some embodiments of the present disclosure. FIG. 1E is an equivalent circuit diagram of the stacked gate device in FIG. 1D in accordance with some embodiments of the present disclosure.

In some embodiments, the stacked gate device 150 of FIG. 1B may include one or more stacked gate devices TX1 to TXN arranged in parallel, as shown in FIG. 1D, where N is a positive integer corresponding to the number of parallel stacked gate devices. In some embodiments, each of the stacked gate devices TX1 to TXN is referred to as a finger structure or a "finger", which includes X transistors 1501 arranged in a cascode structure or a stacked structure, as shown in FIG. 1E. For example, the channel of the transistors 1501 within each stacked gate device TX1 to TXN are connected in series to form the respective channel of each stacked gate device TX1 to TXN. Additionally, the channel of each stacked gate device TX1 to TXN is coupled between the S/D terminal 152 and S/D terminal 153 of the stacked gate device 150, while the gate terminals of stacked gate devices TX1 to TXN are connected to the gate terminal 151 of the stacked gate device 150. When the stacked gate device 150 includes one finger structure, the equivalent circuit diagram of the stacked gate device 150 can be referred to FIG. 1C.

In some embodiments, the transistors 1501 within the stacked gate devices TX1 to TXN may be fabricated within the same process, and thus have substantially the same electrical characteristics, such as channel width, channel length, threshold voltage, and transconductance. In some embodiments, the design of a stacked gate device X with one or more finger structures shown in FIGS. 1D and 1E can be applied in a similar manner to the stacked gate devices X1, X2, X3, X1B, X2B, and X3_trim0 to X3_trimx in FIG. 1A, and similar detailed description is omitted.

In some embodiments, the temperature-sensitive device 110 includes a cascode structure 111 and a cascode structure 112, as depicted in FIG. 1A. The current Ib1 generated by the temperature-sensitive device 110 monotonically increases in accordance with an absolute temperature (e.g., proportional to the absolute temperature (PTAT)) of the voltage reference circuit 100, resulting in the voltage VPTAT generated by the temperature-sensitive device 110 at node N3 to monotonically increase in accordance with the absolute temperature of the voltage reference circuit 100. Accordingly, the temperature-sensitive device 110 can be referred to as a PTAT device. The details thereof will be described with reference to FIGS. 3A to 3B.

In some embodiments, the cascode structure 111 includes stacked gate devices X1 and X2, while the cascode structure 112 includes stacked gate devices X1B and X2B. Each of the gate terminals of the stacked gate devices X1 and X2, the gate terminals of the stacked gate devices X1B and X2B the S/D terminal of the stacked gate device X2 are electrically connected together at node N2. The S/D terminal of the stacked gate device X2 is electrically connected to the S/D terminal of the stacked gate device X1. The S/D terminal of the stacked gate device X1 is connected to the ground voltage (or common reference voltage) VSS.

In some embodiments, the temperature-sensitive device 120 includes the stacked gate device X3. Each of the gate terminal and S/D terminal of the stacked gate device X3, the S/D terminal of transistor M3, the S/D terminal of the plurality of trimming stacked gate devices X3_trim0 to X3_trimx are electrically connected together at node N4 which is an output terminal of the voltage reference circuit 100 configured to provide the reference voltage VREF. Each of the S/D terminal of the stacked gate device X3, the S/D terminal of the stacked gate device X1 and the S/D terminal of the stacked gate device X2 and the S/D terminal of the plurality of trimming stacked gate devices X3_trim0 to X3_trimx are electrically connected together at node N3. The voltage (e.g., Vgs of X3) generated by the temperature-sensitive device 120 monotonically decreases in accordance with the absolute temperature (e.g., complementary to the absolute temperature (CTAT)) of the voltage reference circuit 100. In some embodiments, the temperature-sensitive device 120 can be referred to as a CTAT device. The details thereof will be described with reference to FIGS. 2A to 2B.

In some embodiments, the trimming circuit 130 is configured to adjust (e.g., fine-tune) the matching between the voltage-temperature rising rate of the temperature-sensitive device 110 and the voltage-temperature falling rate of the temperature-sensitive device 120 by a dynamic element matching ("DEM") technique. The trimming circuit 130 may include a plurality of trimming stacked gate devices X3_trim0 to X3_trimx. The gate terminal of each trimming stacked gate device X3_trim0 to X3_trimx is coupled to a respective bit of a trimming code signal TC[0] . . . TC[x] through a corresponding buffer circuit FB0 to FBx. The S/D terminal and S/D terminal of each trimming stacked gate device X3_trim0 to X3_trimx is coupled between node N4 and node N3, which provide the reference voltage VREF and the voltage VPTAT, respectively. Additionally, each of the buffer circuits FB0 to FBx may be supplied with the reference voltage VREF and the ground voltage VSS, as shown in FIG. 1A.

In some embodiments, each of the trimming stacked gate devices X3_trim0 to X3_trimx includes one or more finger structures arranged in parallel, where each finger structure has an equal number of stacked transistors as the stacked gate device X3. In some embodiments, the trimming stacked gate devices X3_trim0 to X3_trimx can have an equal number or different numbers of finger structures as one another, depending on the type of the trimming code signal TC[0] . . . TC[x]. The details thereof will be further described with reference to FIGS. 5A to 5D.

In some embodiments, the gate terminals of transistor M1, M2, and M3 are electrically connected to node N1, and the S/D terminals of transistors M1, M2, and M3 are electrically connected to a power supply voltage VDD. Since transistors M1 and M2 have the same gate-to-source voltage Vgs, transistors M1 and M2 may be configured to function as a first current mirror (not labelled), and the bias current Ib2 passing through the channel of transistor M2 is proportional to the bias current Ib1 passing through the channel of transistor M1. In some embodiments, when transistors M1 and M2 are designed with substantially the same electrical characteristics, such as channel width, channel length, threshold voltage, and transconductance, the bias current Ib2 flowing through transistor M2 is substantially equal to the bias current Ib1 flowing through transistor M1. Thus, in these embodiments, transistor M1 may function as a current source, and the bias current Ib1 flows through transistor M1, the cascode structure 112, and a resistor R. In some embodiments, the resistor R is the resistance of the voltage reference circuit 100. Similarly, transistor M2 may function as another current source, and the bias current Ib2 flows through transistor M2 and the cascode structure 111.

In some embodiments, since transistors M1 and M3 have the same gate-to-source voltage Vgs, transistors M1 and M3 may be configured to function as a second current mirror (not labelled), and the bias current Ib3 passing through the channel of transistor M3 is proportional to the bias current Ib1 passing through the channel of transistor M1. In some embodiments, when transistors M1 and M3 are designed with substantially the same electrical characteristics, such as channel width, channel length, threshold voltage, and transconductance, the bias current Ib3 flowing through transistor M3 is substantially equal to the bias current Ib1 flowing through transistor M1. For example, transistor M3 may function as yet another current source, and the bias current Ib3 flows through transistor M3 of the temperature-sensitive device 120, and the stacked gate device X1. Therefore, a total current of Ib2+Ib3, which is substantially twice the bias current Ib1, flows through the stacked gate device X1, as depicted in FIG. 1A.

Figures 2A, 2B:
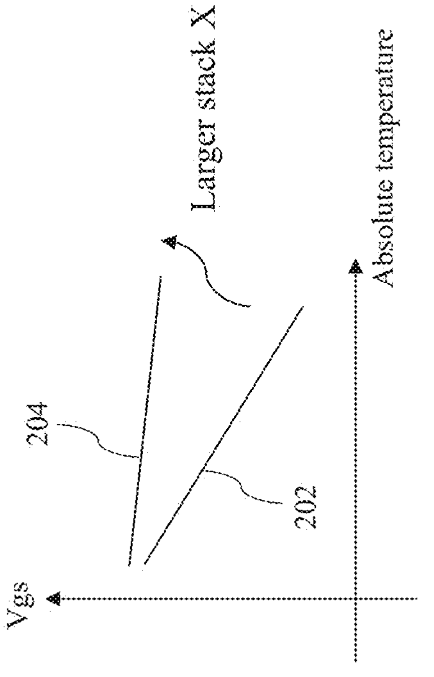
FIG. 2A is a schematic diagram of a stacked gate device in a diode-connected configuration in accordance with some embodiments of the present disclosure.
FIG. 2B is a diagram illustrating variations of a voltage-temperature curve of the stacked gate device in FIG. 2A in accordance with some embodiments of the present disclosure.

FIG. 2A is a schematic diagram of a stacked gate device in a diode-connected configuration in accordance with some embodiments of the present disclosure. FIG. 2B is a diagram illustrating variations of a voltage-temperature curve of the stacked gate device in FIG. 2A in accordance with some embodiments of the present disclosure.

In some embodiments, the stacked gate device 150 is in a diode-connected configuration, indicating that the gate terminal 151 of a stacked gate device 150 is connected to the S/D terminal 152 of the stacked gate device 150, and a bias current Ib is supplied to the stacked gate device 150, as shown in FIG. 2A. In such a case, the voltage difference Vgs between the gate terminal 151 and S/D terminal 153 of the stacked gate device 150 decreases as the absolute temperature of the stacked gate device X increases, as shown by curve 202 in FIG. 2B. Additionally, the downward slope of the voltage-temperature curve depends on the number of stacked transistors within the stacked gate device X. For example, as the number of stacked transistors increases (e.g., a larger stack X), the slope of the V-T curve decreases, as shown by curve 204 in FIG. 2B, indicating that the voltage difference Vgs between the gate terminal 151 and the S/D terminal 153 of the stacked gate device X becomes less sensitive to changes in absolute temperature. As a result, the output voltage VOI generated by the stacked gate device 150 monotonically decreases in accordance with the absolute temperature (e.g., complementary to the absolute temperature (CTAT)). Accordingly, the stacked gate device 150 in the configuration shown in FIG. 2A is configured to operate as a CTAT device, in accordance with some embodiments. Furthermore, since the configuration of the stacked gate device X3 shown in FIG. 1A is similar to that of the stacked gate device 150 shown in FIG. 2A, the stacked gate device X3 can be regarded as a CTAT device, in accordance with some embodiments.

Figure 3B:
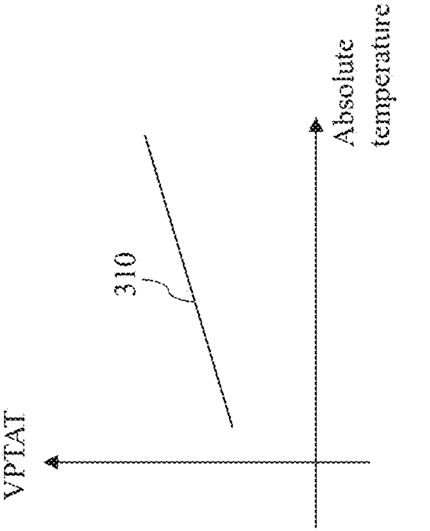
FIG. 3B is a diagram illustrating a voltage-temperature curve of the cascode structure in FIG. 3A in accordance with some embodiments of the present disclosure.
Figure 3A:
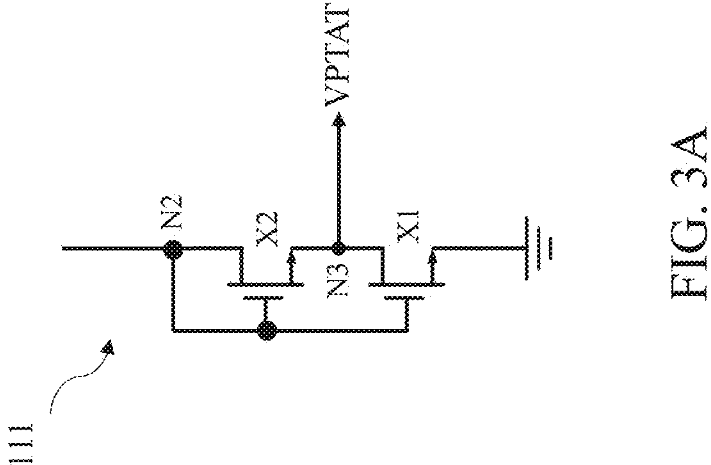
FIG. 3A is a schematic diagram of a cascode structure in accordance with some embodiments of the present disclosure.

FIG. 3A is a schematic diagram of a cascode structure in accordance with some embodiments of the present disclosure. FIG. 3B is a diagram illustrating a voltage-temperature curve of the cascode structure in FIG. 3A in accordance with some embodiments of the present disclosure.

In some embodiments, the cascode structure 111 shown in FIG. 1A is a PTAT device which can be implemented by the stacked gate devices X1 and X2. The gate terminals of the stacked gate devices X1 and X2 are connected to node N2. The stacked gate devices X1 and X2 may be single threshold voltage (e.g., single Vt) stacked gate devices, which indicates that the transistors within the stacked gate devices X1 and X2 have substantially the same threshold voltage Vt, resulting in high PTAT correlation between the gate-to-source voltage Vgs_X2 of the stacked gate device X2 and the gate-to-source voltage Vgs_X1 of the stacked gate device X1. As described in the embodiments of FIGS. 2A-2B, both the gate-to-source voltage Vgs_X2 and the gate-to-source voltage Vgs_X1 decreases as the temperature increases.

In some embodiments, the downward slope of the V-T curve of the stacked gate device X2 can become less steep as the number of stacked transistors within the stacked gate device X2 increases. Similarly, in some embodiments, the downward slope of the V-T curve of the stacked gate device X1 can also become less steep as the number of stacked transistors within the stacked gate device X1 increases. In some embodiments, when the number of stacked transistors within the stacked gate device X1 is larger than that within the stacked gate device X2, the cascode structure 111 can function as a PTAT device. For example, the output voltage VPTAT of the cascode structure 111 can be calculated as Vgs_X1–Vgs_X2. As the temperature increases, the decrement of the gate-to-source voltage Vgs_X2 of the stacked gate device X2 is greater than the decrement of the gate-to-source voltage Vgs_X1 of the stacked gate device X1, such that the voltage difference Vgs_X1–Vgs_X2 increases. Accordingly, the voltage VPTAT at node N3 versus the temperature can be plotted as a V-T curve 310, as shown in FIG. 3B, which has an upward slope. In some embodiments, the upward slope of curve 310 depends on the difference X1–X2 between the numbers X1 and X2. In some embodiments, the upward slope of curve 310 increases as the difference X1–X2 increases. In some embodiments, the output voltage VPTAT of the cascode structure 111, which is proportional to the absolute temperature, can be used to compensate the output voltage (e.g., Vgs_X3), which is complementary to the absolute temperature, generated by the temperature-sensitive device 120 (e.g., stacked gate device X3), allowing the voltage reference circuit 100 to generate the reference voltage VREF with a temperature coefficient (TC) close to zero.

Attention now is directed back to FIG. 1A. In some embodiments, the cascode structure 111 works together with the cascode structure 112 to enable the temperature-sensitive device 110 to function as a PTAT device. The cascode structure 112 is similar to the cascode structure 111, and similar detailed description is omitted. For example, the number X1B of stacked transistors within the stacked gate device X1B is equal to the number X1 of stacked transistors within the stacked gate device X1 (i.e., X1=X1B), while the number X1B of stacked transistors within the stacked gate device X2B is equal to the number X2 of stacked transistors within the stacked gate device X2 (i.e., X2=X2B). In some embodiments, since the overall bias current Ib2+Ib3 flowing through the stacked gate device X1 is approximately twice the bias current Ib1 flowing through the stacked gate devices X1B and X2B of the cascode structure 112, the stacked gate device X1 can be designed to have twice the number of finger structures as the stacked gate device X1B. In some embodiments, the stack gate devices X2 and X2B have the same number of finger structures as each other.

In some embodiments, the overall size (e.g., width of channels) of finger structures within the stacked gate device X1B and X2B is larger than that within the stacked gate device X1 and X2. Accordingly, the gate-to-source voltage Vgs_X1BX2B of the stacked gate devices X1B and X2B within the cascode structure 112 is lower than the gate-to-source voltage Vgs_X1X2 of the stacked gate devices X1 and X2 within the cascode structure 111. Furthermore, the bias current Ib1 flowing through the resistor R can be expressed by equation (1) as follows.

$$I_{b1} = \frac{Vgs\_X1X2 - Vgs\_X1BX2B}{R} \tag{1}$$

In some embodiments, since the overall size of finger structures within the stacked gate device X1B and X2B is larger than that within the stacked gate device X1 and X2, the decrement rate of the gate-to-source voltage Vgs_X1X2 is lower than that of the gate-to-source voltage Vgs_X1BX2B as the temperature increases. Accordingly, the voltage difference (Vgs_X1X2–Vgs_X1BX2B) is proportional to the absolute temperature, and thus the bias current Ib1 flowing through the resistor R is a PTAT current. Furthermore, since transistors M1 and M2 forms a current mirror, the bias current Ib2 generated by transistor M2 is also a PTAT current. Similarly, since transistor M1 and M3 forms another current mirror, the bias current Ib3 generated by transistor M3 is also a PTAT current.

More specifically, the bias current Ib3, which is a PTAT current, flows through the temperature-sensitive device 120 (e.g., stacked gate device X3). As the temperature increases, the bias current Ib3 increases, leading to an increase of the gate-to-source voltage Vgs_X3. That is, the gate-to-source voltage Vgs_X3 is PTAT. However, as described in the embodiments of FIGS. 2A-2B, since the stacked gate device X3 is in a diode-connected configuration, the stacked gate device X3 can be regarded as a CTAT device. On the other hand, the voltage VPTAT generated by the temperature-sensitive device 110 at node N3 is PTAT, as described in the embodiments of FIGS. 3A-3B. Accordingly, for the temperature-sensitive device 120, the PTAT scheme (e.g., Ib3 and VPTAT) can be compensated with the CTAT scheme (e.g., Vgs_X3), allowing the voltage reference circuit 100 to generate the reference voltage VREF with a temperature coefficient substantially equal to 0 at node N4, in accordance with some embodiments.

Figure 4:
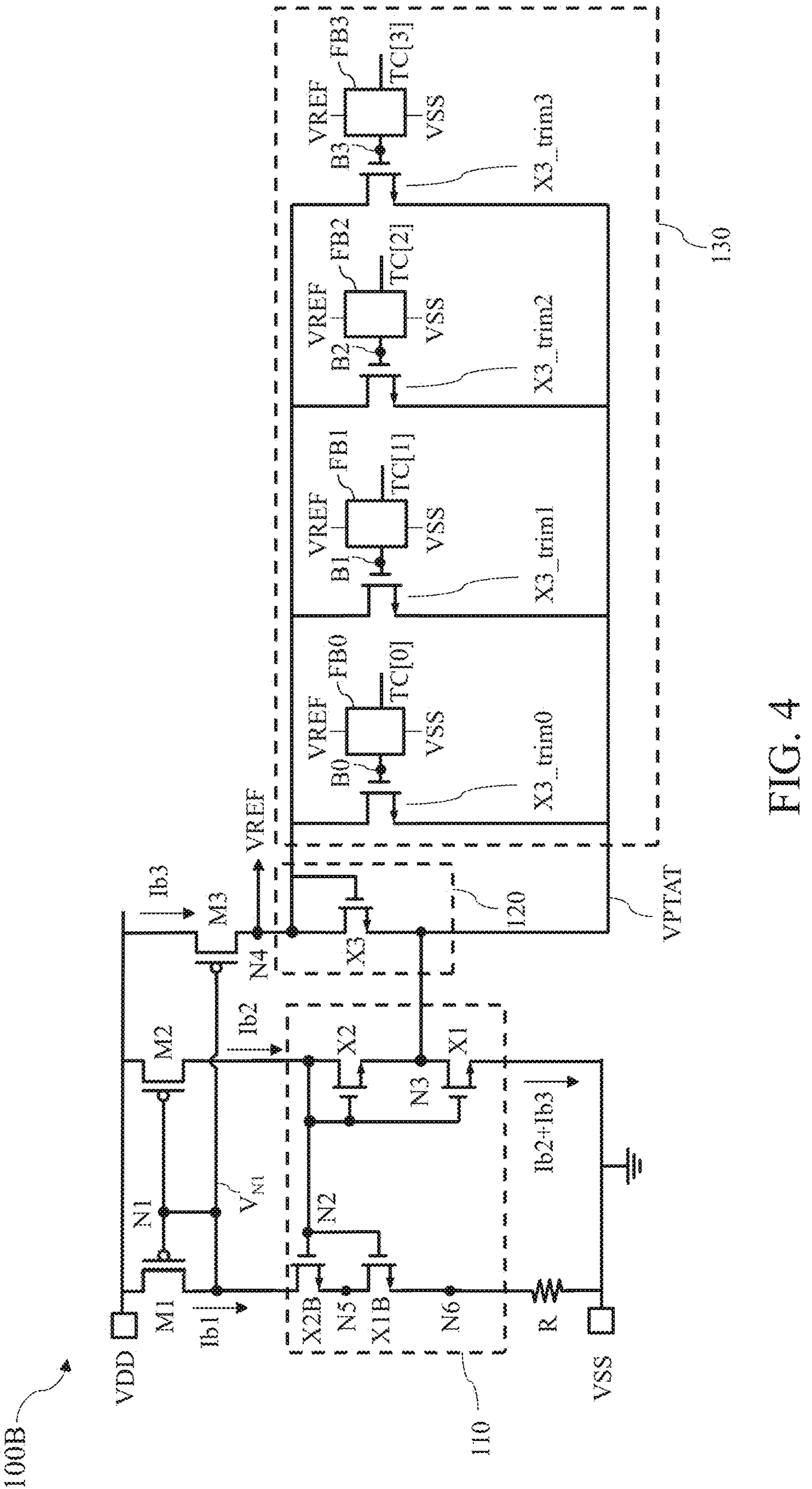
FIG. 4 is a schematic diagram of a voltage reference circuit in accordance with some embodiments of the present disclosure.
Figure 5B:
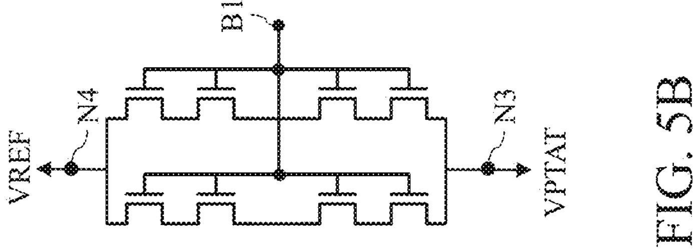
FIGS. 5A-5D are schematic diagrams of trimming stacked gate devices with different number of finger structures in accordance with some embodiments of the present disclosure.
Figure 5A:
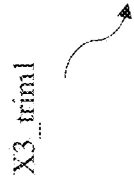
Figure 5A:
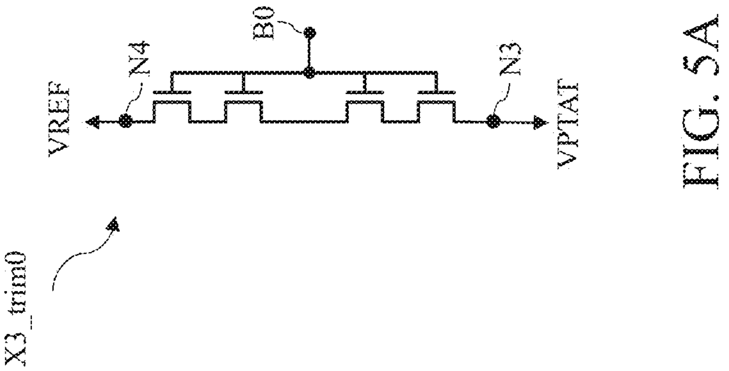
Figure 5D:
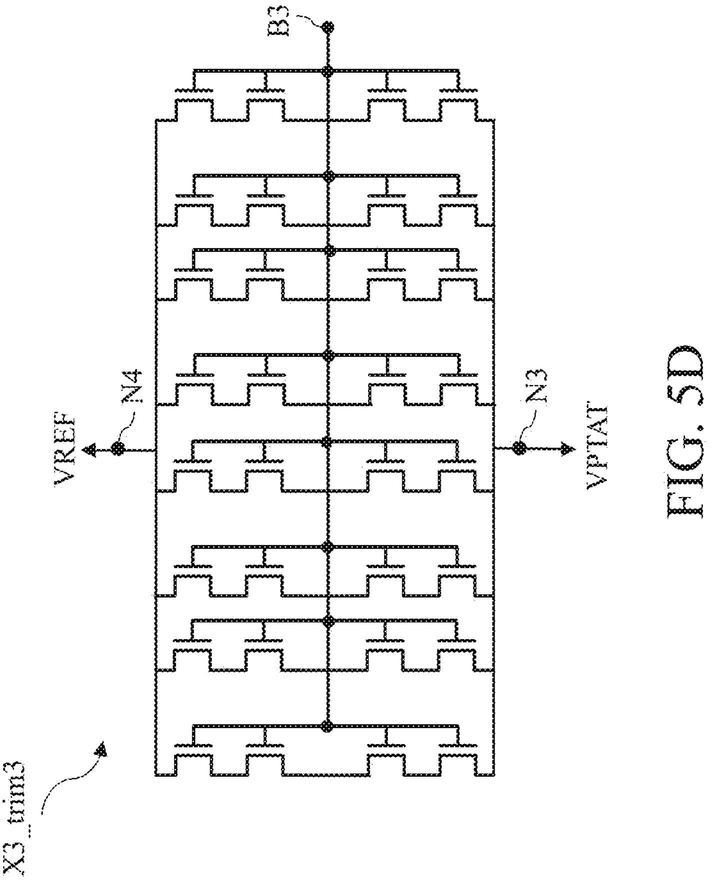
Figure 5C:
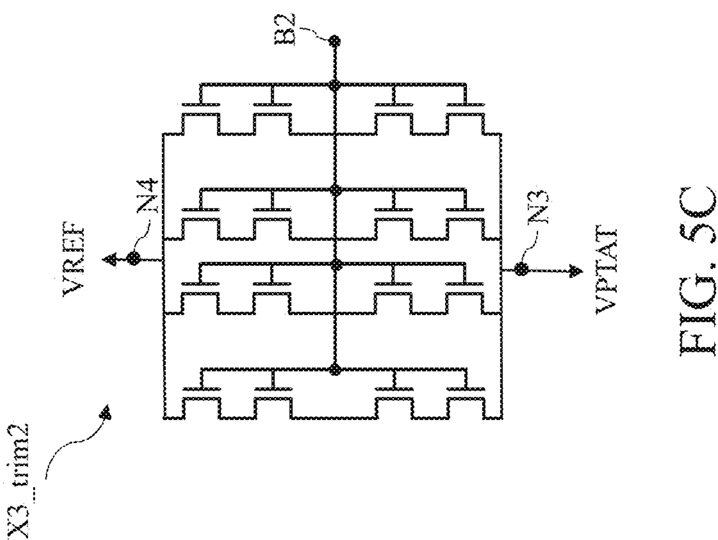

FIG. 4 is a schematic diagram of a voltage reference circuit in accordance with some embodiments of the present disclosure.

In some embodiments, the CTAT scheme can be adjusted by the trimming circuit 130. For brevity, the trimming circuit 130 within the voltage reference circuit 100B shown in FIG. 4 may include four trimming stacked gate devices X3_trim0 to X3_trim3 that are controlled by respective bits of the trimming code signal TC[0:3] through respective buffer circuits FB0 to FB3. In some embodiments, the buffer circuits FB0 to FB3 are supplied with the reference voltage VREF and the ground voltage VSS. Additionally, each bit of the trimming code signal TC[0:3] may be passed to the gate terminals B0 to B3 of the trimming stacked gate devices X3_trim0 to X3_trim3 through the respective buffer circuits FB0 to FB3. In some embodiments, the voltage range of each bit of the trimming code signal TC[0:3] is between the reference voltage VREF and the ground voltage VSS.

In some embodiments, each of the trimming stacked gate device X3_trim0 to X3_trim3 may have the same number of finger structures, such as 1 to N, where N is a positive integer. When thermal meter coding is used for the trimming circuit 130, each bit of the trimming code signal TC[0:3] can control an equal number of finger structures to couple to the stacked gate device X3 in parallel. For brevity, it is assumed that each of the trimming stacked gate device X3_trim0 to X3_trim3 has one finger structure, in accordance with some embodiments. When the trimming code signal TC[3:0] is equal to 1101, the reference voltage VREF is passed to the gate terminals B0, B2, and B3 of the trimming stacked gate device X3_trim0, X3_trim2 and X3_trim3, activating the trimming stacked gate devices X3_trim0, X3_trim2 and X3_trim3. Meanwhile, the ground voltage VSS is passed to the gate terminal B1, deactivating the trimming stacked gate device X3_trim1. Accordingly, a total number of 3 finger structures are activated and coupled in parallel with each other, and further coupled to the stacked gate device X3 so as to adjust the downward slope of the V-T curve of the stacked gate device X3, thereby performing temperature-coefficient trimming on the reference voltage VREF generated by the voltage reference circuit 100B.

In some embodiments, each of the trimming stacked gate devices X3_trim0 to X3_trim3 may have different numbers of finger structures, such as powers of 2. For brevity, it is assumed that there are 4 stacked transistors within the stacked gate device X3. The trimming stacked gate devices X3_trim0 to X3_trim3 include 1, 2, 4, and 8 finger structures, respectively, with each finger structure including 4 stacked transistors, as shown in FIGS. 5A-5D, in accordance with some embodiments. When binary coding is used for the trimming circuit 130, each bit of the trimming code signal TC[0:3] can control different numbers of finger structures to be coupled together in parallel and further coupled to the stacked gate device X3 in parallel. When the trimming code signal TC[3:0] is equal to 1101, the reference voltage VREF is passed to the gate terminals B0, B2, and B3 of the trimming stacked gate device X3_trim0, X3_trim2, and X3_trim3, activating the trimming stacked gate device X3_trim0, X3_trim2, and X3_trim3. Meanwhile, the ground voltage VSS is passed to the gate terminal B1, deactivating the trimming stacked gate device X3_trim1. Accordingly, a total number of 13 (e.g., 1+4+8) finger structures are activated to couple to the stacked gate device X3 in parallel so as to adjust the downward slope of the V-T curve of the stacked gate device X3, thereby performing temperature-coefficient trimming on the reference voltage VREF generated by the voltage reference circuit 100B.

FIGS. 6A-6D are schematic diagrams of a buffer circuit in different implementations in accordance with some embodiments of the present disclosure.

Figure 6B:
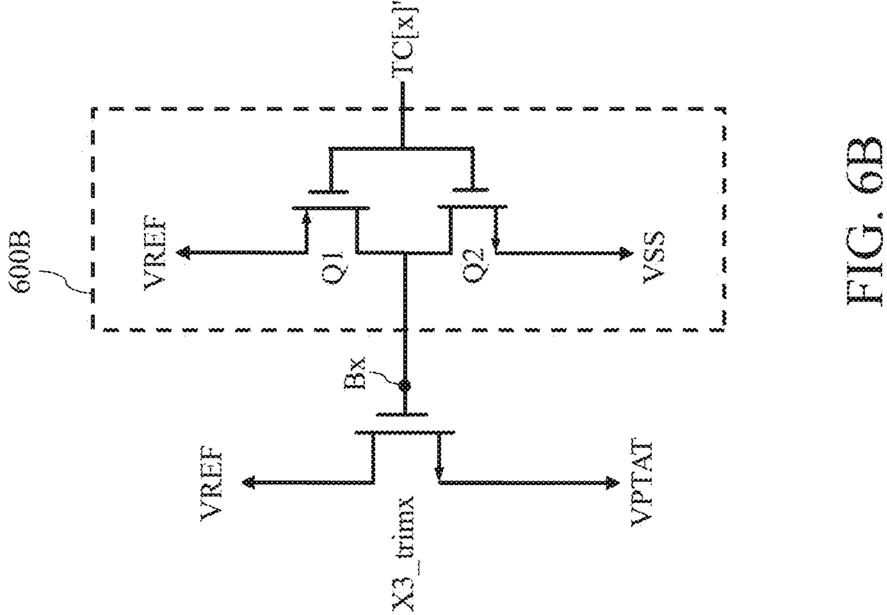
FIGS. 6A-6D are schematic diagrams of a buffer circuit in different implementations in accordance with some embodiments of the present disclosure.
Figure 6A:
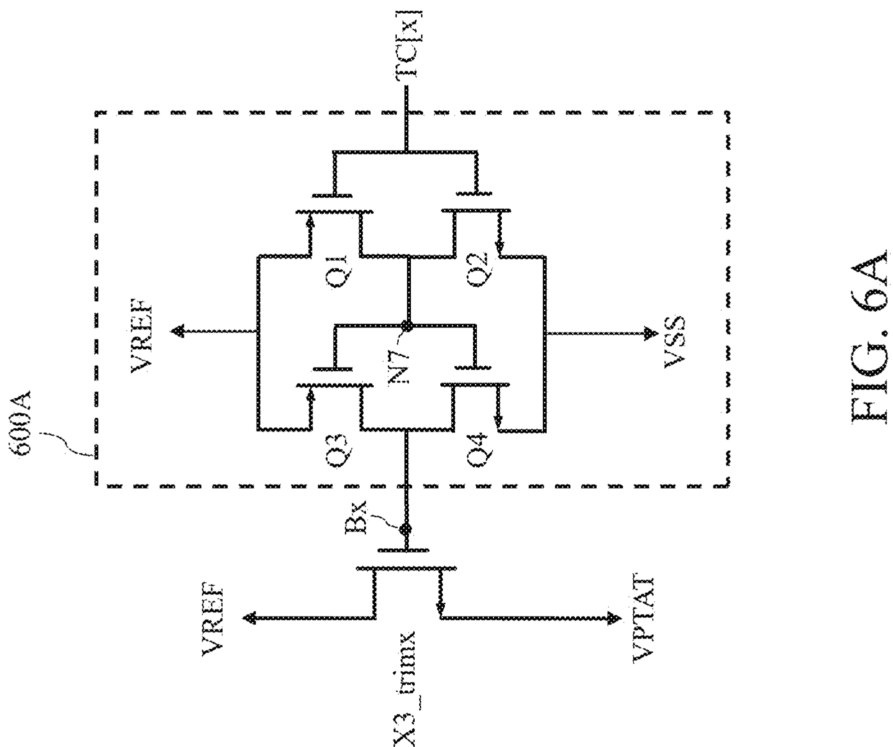

In some embodiments, at least one or more of the buffer circuits FB0 to FBx in FIG. 1A can be implemented using the buffer circuit 600A shown in FIG. 6A. The buffer circuit 600A includes two inverters (e.g., transistors Q1+Q2 and Q3+Q4) connected in series, that are supplied with the reference voltage VREF and the ground voltage VSS. The input signal TC[x] of the buffer circuit 600A can be passed to the gate terminal Bx of the trimming stacked gate device X3_trimx through the buffer circuit 600A. Additionally, when the input signal TC[x] is in the high logic state and the low logic state, the input signal TC[x] can be at the reference voltage VREF and the ground voltage VSS, respectively. For example, in response to the input signal TC[x] being in the high logic state (e.g., "1"), transistor Q2 is turned on and transistor Q1 is turned off, causing the voltage at node N7 to be pulled down to the ground voltage VSS. At this time, transistor Q3 is turned on and transistor Q4 is turned off, causing the voltage at the gate terminal Bx to be pulled up to the reference voltage VREF. As a result, the trimming stacked gate device X3_trimx is turned on (e.g., selected), and the one or more finger structures within the trimming stacked gate device X3_trimx are coupled to the stacked gate device X3 in parallel, indicating that the selected trimming stacked gate device X3_trimx can contribute to the V-T curve of the temperature-sensitive device 120.

On the other hand, in response to the input signal TC[x] being in the low logic state (e.g., "0"), transistor Q1 is turned on and transistor Q2 is turned off, causing the voltage at node N7 to be pulled up to the reference voltage VREF. At this time, transistor Q4 is turned on and transistor Q3 is turned off, causing the voltage at the gate terminal Bx to be pulled down to the ground voltage VSS. As a result, the trimming stacked gate device X3_trimx is turned off (e.g., unselected), and the one or more finger structures within the trimming stacked gate device X3_trimx are not coupled to the stacked gate device X3, indicating that the unselected trimming stacked gate device X3_trimx has no influence on the V-T curve of the temperature-sensitive device 120.

In some embodiments, each of the buffer circuits FB0 to FBx in FIG. 1A can be implemented using the buffer circuit 600B shown in FIG. 6B. The input signal of the buffer circuit 600B may be TC[x]' which is complementary to the respective bit TC[x] of the trimming signal TC. For example, in response to the input signal TC[x]' being in the high logic state (e.g., "1"), transistor Q2 is turned on and transistor Q1 is turned off, causing the voltage at the gate terminal Bx to be pulled down to the ground voltage VSS. As a result, the trimming stacked gate device X3_trimx is turned off (e.g., unselected), and the one or more finger structures within the trimming stacked gate device X3_trimx are not coupled to the stacked gate device X3, indicating that the unselected trimming stacked gate device X3_trimx has no influence on the V-T curve of the temperature-sensitive device 120. On the other hand, in response to the input signal TC[x]' being in the low logic state (e.g., "0"), transistor Q1 is turned on and transistor Q2 is turned off, causing the voltage at the gate terminal Bx to be pulled up to the reference voltage VREF. As a result, the trimming stacked gate device X3_trimx is turned on (e.g., selected), and the one or more finger structures within the trimming stacked gate device X3_trimx are coupled to the stacked gate device X3 in parallel, indicating that the selected trimming stacked gate device X3_trimx can contribute to the V-T curve of the temperature-sensitive device 120.

Figure 6D:
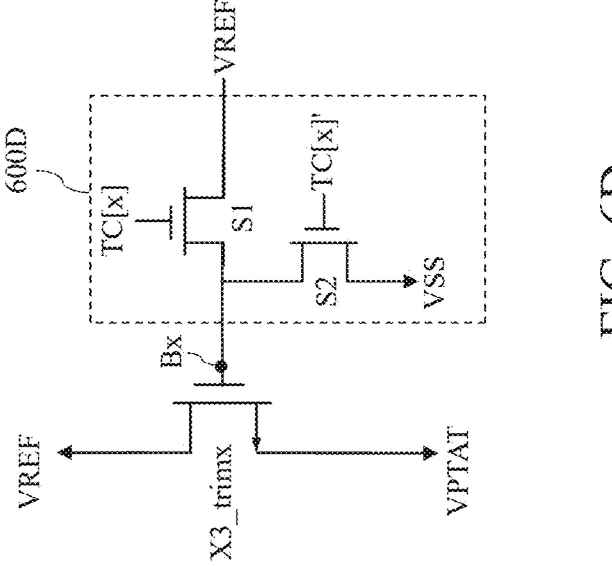
Figure 6C:
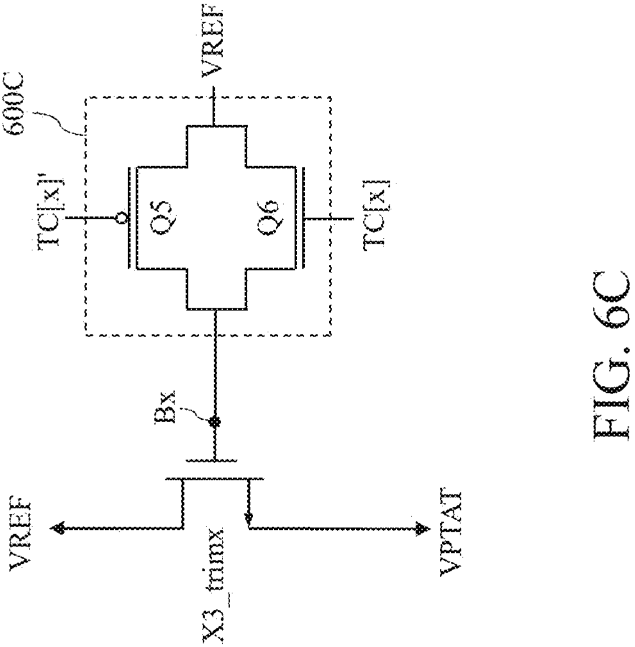

In some embodiments, at least one or more of the buffer circuits FB0 to FBx in FIG. 1A can be implemented using the buffer circuit 600C shown in FIG. 6C. The buffer circuit 600C may be implemented using a CMOS transmission gate which includes transistors Q5 and Q6. In response to the input signals TC[x] and TC[x]' being respectively in the high logic state (e.g., "1") and the low logic state (e.g., "0"), transistors Q5 and Q6 are turned on, causing the reference voltage VREF to be passed to the gate terminal Bx through the buffer circuit 600C. As a result, the trimming stacked gate device X3_trimx is turned on (e.g., selected), and the one or more finger structures within the trimming stacked gate device X3_trimx are coupled to the stacked gate device X3 in parallel, indicating that the selected trimming stacked gate device X3_trimx can contribute to the V-T curve of the temperature-sensitive device 120. On the other hand, in response to the input signals TC[x] and TC[x]' being respectively in the low logic state (e.g., "0") and the high logic state (e.g., "1"), transistors Q5 and Q6 are turned off, causing the gate terminal Bx to be in a floating state. When the gate terminal Bx of the trimming stacked gate device X3_trimx is floating, the trimming stacked gate device X3_trimx is turned off (e.g., unselected), and the one or more finger structures within the trimming stacked gate device X3_trimx are not coupled to the stacked gate device X3, indicating that the unselected trimming stacked gate device X3_trimx has no influence on the V-T curve of the temperature-sensitive device 120.

In some embodiments, at least one or more of the buffer circuits FB0 to FBx in FIG. 1A can be implemented using the buffer circuit 600D shown in FIG. 6D. The buffer circuit 600D includes switches S1 and S2 that are respectively controlled by the input signals TC[x] and TC[x]'. In response to the input signals TC[x] and TC[x]' being respectively in the high logic state (e.g., "1") and the low logic state (e.g., "0"), switch S1 is activated and switch S2 is deactivated, causing the reference voltage VREF to be passed to the gate terminal Bx through switch S1. As a result, the trimming stacked gate device X3_trimx is turned on (e.g., selected), and the one or more finger structures within the trimming stacked gate device X3_trimx are coupled to the stacked gate device X3 in parallel, indicating that the selected trimming stacked gate device X3_trimx can contribute to the V-T curve of the temperature-sensitive device 120. On the other hand, in response to the input signals TC[x] and TC[x]' being respectively in the low logic state (e.g., "0") and the high logic state (e.g., "1"), switch S1 is deactivated and switch S2 is activated, causing the voltage at the gate terminal Bx to be pulled down to the ground voltage VSS. As a result, the trimming stacked gate device X3_trimx is turned off (e.g., unselected), and the one or more finger structures within the trimming stacked gate device X3_trimx are not coupled to the stacked gate device X3, indicating that the unselected trimming stacked gate device X3_trimx has no influence on the V-T curve of the temperature-sensitive device 120.

Figure 7:
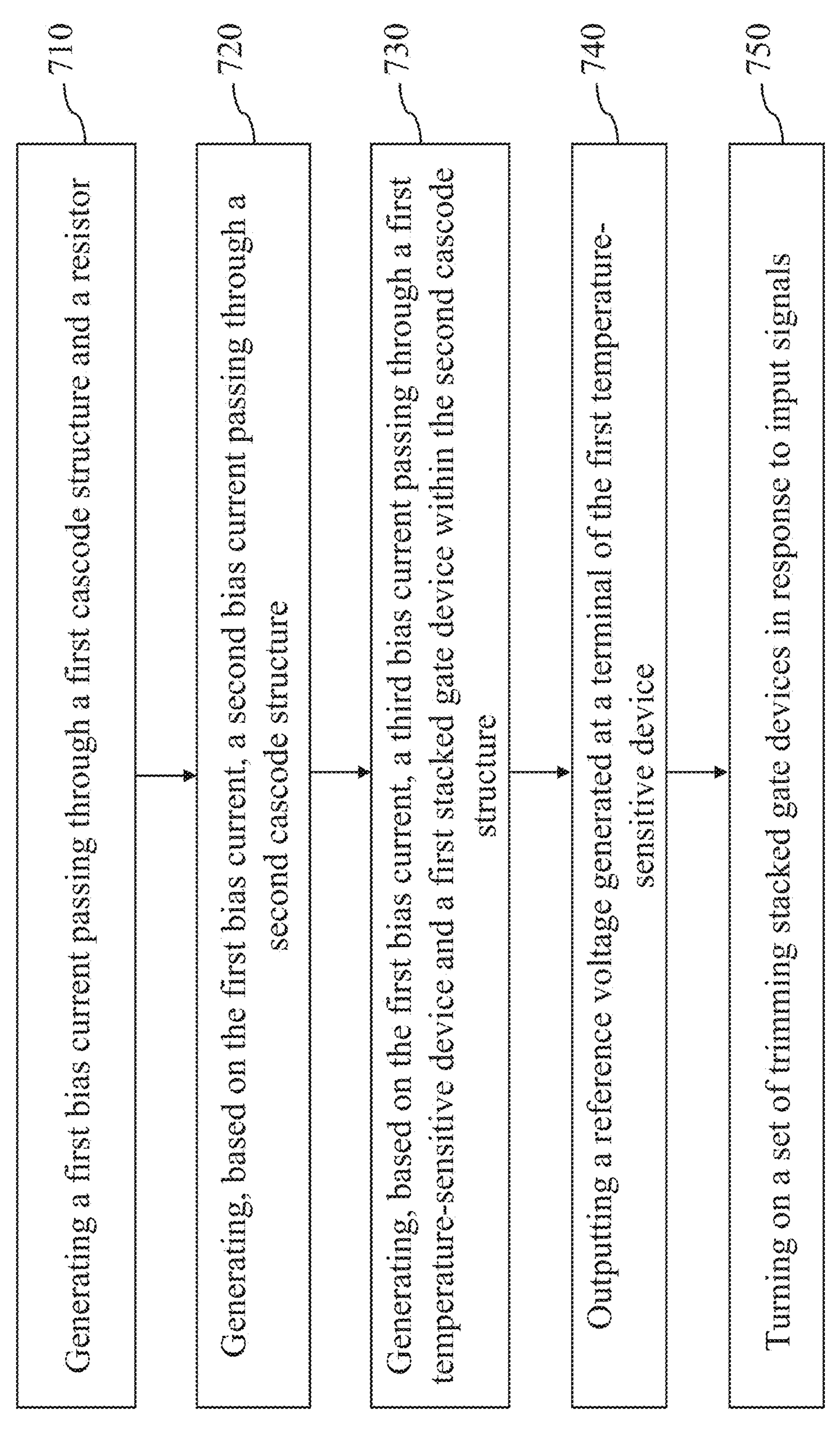
FIG. 7 is a flowchart of a method for operating a voltage reference circuit in accordance with some embodiments of the present disclosure.

FIG. 7 is a flowchart of a method for operating a voltage reference circuit in accordance with some embodiments of the present disclosure. The sequence in which the operations of method 700 are depicted in FIG. 7 is for illustration only; the operations of method 700 are capable of being executed in sequences that differ from that depicted in FIG. 7. It is understood that additional operations may be performed before, during, and/or after the method 700 depicted in FIG. 7, and that some other processes may only be briefly described herein.

In operation 710, a first bias current is generated to pass through a first cascode structure within a first temperature-sensitive device and a resistor. In the embodiment of FIG. 1A, the temperature-sensitive device 110 generates the bias current Ib1 (e.g., the first bias current) passing through the cascode structure 112, which includes stacked gate devices X1B and X2B, and the resistor R. Additionally, the bias current Ib1 (e.g., the first bias current) is proportional to the absolute temperature.

In operation 720, a second bias current is generated to pass through a second cascode structure within the first temperature-sensitive device based on the first bias current. In the embodiment of FIG. 1A, transistors M1 and M2 form a first current mirror, and the bias current Ib2 (e.g., the second bias current) is generated by transistor M2 based on the bias current Ib1. Since the bias current Ib1 is PTAT, the bias current Ib2 is also PTAT. Additionally, the cascode structure 111 (e.g., second cascode structure) includes the stacked gate device X1 and X2.

In operation 730, a third bias current is generated to pass through a second temperature-sensitive device and a first stacked gate device within the second cascode structure based on the first bias current. In the embodiment of FIG. 1A, the second temperature-sensitive device includes the stacked gate device X3, and the bias current Ib3 (e.g., the third bias current) passes through the stacked gate device X3 and the first stacked gate device X1. Additionally, the stacked gate device X3 is a CTAT device.

In operation 740, a reference voltage generated at a terminal of the second temperature-sensitive device is outputted. In the embodiment of FIG. 1A, the reference voltage VREF is generated at the S/D terminal (e.g., node N4) of the stacked gate device X3. The reference voltage VREF is the sum of the gate-to-source voltage of the stacked gate device X3 and the voltage VPTAT generated by the temperature-sensitive device 110 at node N3.

In operation 750, turning on a set of trimming stacked gate devices in response to input signals TC. In some embodiments, operation 750 includes feeding back the reference voltage to the set of trimming stacked devices, and turning on the set of trimming stacked gate devices in response to input signals TC. In some embodiments, the set of trimming stacked gate devices includes one or more of trimming stacked gate devices X3_trim0 to X3_trimx. In some embodiments, one or more selected trimming stacked gate device(s) in the set of trimming stacked gate devices can contribute to the V-T curve of the temperature-sensitive device 120 thereby adjusting the V-T curve of the temperature-sensitive device 120 consistent with the description of the present disclosure described herein. In some embodiments, operation 750 includes performing temperature-coefficient trimming on the reference voltage VREF by the set of trimming stacked devices (e.g., the trimming circuit 130). In some embodiments, operation 750 includes adjusting the CTAT scheme by the set of trimming stacked devices (e.g., the trimming circuit 130).

An aspect of the present disclosure provides an integrated circuit, which includes a first temperature-sensitive device and a second temperature-sensitive device. The first temperature-sensitive device is configured to generate a first bias current which monotonically increases in accordance with an absolute temperature, and generate a first voltage based on the first bias current. The second temperature-sensitive device is configured to generate a second voltage across the second temperature-sensitive device, and output a reference voltage at an output terminal of the integrated circuit. The second voltage monotonically decreases in accordance with the absolute temperature. The reference voltage equals the first voltage plus the second voltage.

Another aspect of the present disclosure provides an integrated circuit, which includes a first cascode structure, a second cascode structure, a first current mirror, a second current mirror, and a first stacked gate device. The first cascode structure is configured to generate a first bias current which is proportional to an absolute temperature. The first current mirror is configured to generate a second bias current in response to the first bias current. The second cascode structure is coupled to the first cascode structure, and configured to generate a first voltage at a first node in response to the second bias current. The second current mirror is configured to generate a third bias current in response to the first bias current. The third bias current is proportional to the absolute temperature. The first stacked gate device is coupled between the first node and an output terminal of the integrated circuit, and configured to receive the third bias current, generate a second voltage across the first stacked gate device, and output a reference voltage at the output terminal of the integrated circuit. The second voltage is complementary to the absolute temperature. The reference voltage equals the first voltage plus the second voltage.

Yet another aspect of the present disclosure provides a method. The method includes the following steps: generating a first bias current passing through a first cascode structure and a resistor; generating, based on the first bias current, a second bias current passing through a second cascode structure; generating, based on the first bias current, a third bias current passing through a temperature-sensitive device and a first stacked gate device within the second cascode structure; and outputting a reference voltage generated at a terminal of the temperature-sensitive device.

The methods and features of the present disclosure have been sufficiently described in the provided examples and descriptions. It should be understood that any modifications or changes without departing from the spirit of the present disclosure are intended to be covered in the protection scope of the present disclosure.

Moreover, the scope of the present application is not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, can be utilized according to the present disclosure.

Accordingly, the appended claims are intended to include within their scope processes, machines, manufacture, compositions of matter, means, methods or steps. In addition, each claim constitutes a separate embodiment, and the combination of various claims and embodiments are within the scope of the present disclosure.

What is claimed is:

1. An integrated circuit, comprising:

a first temperature-sensitive device configured to generate a first bias current which monotonically increases in accordance with an absolute temperature of the integrated circuit, and generate a first voltage based on the first bias current; and a second temperature-sensitive device configured to generate a second voltage across the second temperature-sensitive device, and output a reference voltage at an output terminal of the integrated circuit, wherein the second voltage monotonically decreases in accordance with the absolute temperature of the integrated circuit, wherein the reference voltage is equal to a sum of the first voltage and the second voltage, wherein the first temperature-sensitive device comprises:

a first cascode structure comprising:

a first stacked gate device having a gate terminal connected to a first node, a first terminal connected to a second node, and a second terminal connected to a ground voltage; and a second stacked gate device having a gate terminal connected to the first node, a first terminal connected to the first node, and a second terminal connected to the second node; and a second cascode structure comprising:

a third stacked gate device having a gate terminal connected to the first node, a first terminal connected to a third node, and a second terminal connected to a fourth node; and a fourth stacked gate device having a gate terminal connected to the first node, a first terminal connected to a fifth node, and a second terminal connected to the third node.

2. The integrated circuit of claim 1, wherein the first voltage is proportional to the absolute temperature of the integrated circuit, and the second voltage is complementary to the absolute temperature of the integrated circuit.

3. The integrated circuit of claim 1, further comprising:

a resistor coupled between the fourth node and the ground voltage.

4. The integrated circuit of claim 3, wherein:

the first stacked gate device comprises a plurality of first finger structures arranged in parallel with each other, wherein each first finger structure of the plurality of first finger structures comprises a first number of field-effect transistors connected in series;

the second stacked gate device comprises one or more second finger structures arranged in parallel with each other, wherein each second finger structure of the one or more second finger structures comprises a second number of field-effect transistors connected in series; and the first number is greater than the second number.

5. The integrated circuit of claim 4, wherein:

the third stacked gate device comprises one or more third finger structures arranged in parallel with each other, wherein each third finger structure of the one or more third finger structures comprises the first number of field-effect transistors connected in series;

the fourth stacked gate device comprises one or more fourth finger structures arranged in parallel with each other, wherein each fourth finger structure of the one or more fourth finger structures comprises the second number of field-effect transistors connected in series;

a number of the first finger structures is twice that of the third finger structures; and a number of the second finger structures is equal to the fourth finger structures.

6. The integrated circuit of claim 5, wherein an overall width of the third finger structures and the fourth finger structures is greater than an overall width of the first finger structures and the second finger structures.

7. The integrated circuit of claim 5, wherein the field-effect transistors within the first stacked gate device, the second stacked gate device, the third stacked gate device and the fourth stacked gate device have a substantially equal threshold voltage to each other.

8. The integrated circuit of claim 5, wherein:

the second temperature-sensitive device further comprises a fifth stacked gate device having a gate terminal connected to the output terminal of the integrated circuit, a first terminal connected to the output terminal of the integrated circuit, and a second terminal connected to the second node; and the fifth stacked gate device comprises one or more fifth finger structures, with each fifth finger structure comprising a third number of field-effect transistors connected in series.

9. The integrated circuit of claim 8, further comprising:

a trimming circuit comprising:

a plurality of trimming stacked gate devices arranged in parallel to the fifth stacked gate device; and a plurality of buffer circuits;

wherein each of the trimming stacked gate devices is configured to receive a corresponding bit of a trimming code signal by a corresponding one of the buffer circuits.

10. The integrated circuit of claim 9, wherein each of the trimming stacked gate devices of the plurality of trimming stacked gate devices comprises a different number of finger structures in powers of 2, and each finger structure within each of the trimming stacked gate devices of the plurality of trimming stacked gate devices comprises the third number of field-effect transistors connected in series.

11. The integrated circuit of claim 9, wherein each of the trimming stacked gate devices of the plurality of trimming stacked gate devices comprises an equal number of finger structures, and each finger structure within each of the trimming stacked gate devices of the plurality of trimming stacked gate devices comprises the third number of field-effect transistors connected in series.

12. The integrated circuit of claim 9, wherein in response to a first bit of a first trimming stacked gate device of the plurality of trimming stacked gate devices being in a first logic state, the reference voltage is supplied to a gate terminal of the first trimming stacked gate device of the plurality of trimming stacked gate devices through a first buffer circuit of the plurality of buffer circuits thereby enabling the first trimming stacked gate device of the plurality of trimming stacked gate devices to be electrically coupled to the fifth stacked gate device in parallel.

13. The integrated circuit of claim 12, wherein in response to the first bit of the first trimming stacked gate device of the plurality of trimming stacked gate devices being in a second logic state complementary to the first logic state, the ground voltage is supplied to the gate terminal of the first trimming stacked gate device of the plurality of trimming stacked gate devices through the first buffer circuit of the plurality of buffer circuits thereby disabling the first trimming stacked gate device of the plurality of trimming stacked gate devices from being electrically coupled to the fifth stacked gate device in parallel.

14. An integrated circuit, comprising:

a first cascode structure configured to generate a first bias current that is proportional to an absolute temperature of the integrated circuit;

a first current mirror configured to generate a second bias current in response to the first bias current;

a second cascode structure coupled to the first cascode structure, and configured to generate a first voltage at a first node in response to the second bias current;

a second current mirror configured to generate a third bias current in response to the first bias current, wherein the third bias current is proportional to the absolute temperature of the integrated circuit; and a first stacked gate device coupled between the first node and an output terminal of the integrated circuit, and configured to receive the third bias current, generate a second voltage across the first stacked gate device, and output a reference voltage at the output terminal of the integrated circuit;

wherein the second voltage is complementary to the absolute temperature of the integrated circuit, wherein the reference voltage is equal to a sum of the first voltage and the second voltage.

15. The integrated circuit of claim 14, further comprising:

a resistor, wherein the first bias current is configured to flow from a power supply voltage to a ground voltage through the first current mirror, the second cascode structure, and the resistor.

16. The integrated circuit of claim 15, wherein a third voltage across the first cascode structure is greater than a fourth voltage across the second cascode structure.

17. The integrated circuit of claim 16, wherein:

the first cascode structure comprises:

a second stacked gate device having a gate terminal connected to a second node, a first terminal connected to the first node, and a second terminal connected to the ground voltage; and a third stacked gate device having a gate terminal connected to the second node, a first terminal connected to the second node, and a second terminal connected to the first node; and the second cascode structure comprises:

a fourth stacked gate device having a gate terminal connected to the second node, a first terminal connected to a third node, and a second terminal connected to the resistor; and a fifth stacked gate device, having a gate terminal connected to the second node, a first terminal connected to the first current mirror, and a second terminal connected to the third node.

18. A method, comprising:

generating a first bias current passing through a first cascode structure and a resistor;

generating, based on the first bias current, a second bias current passing through a second cascode structure;

generating, based on the first bias current, a third bias current passing through a temperature-sensitive device and a first stacked gate device within the second cascode structure;

outputting a reference voltage generated at a terminal of the temperature-sensitive device;

generating a first voltage by the second cascode structure in response to the second bias current; and generating, by the temperature-sensitive device, a second voltage across the temperature-sensitive device;

wherein the first voltage is proportional to an absolute temperature, and the second voltage is complementary to the absolute temperature, wherein the reference voltage is a sum of the first voltage and the second voltage.

19. The integrated circuit of claim 14, wherein the first stacked gate device has a source terminal coupled to the first node, and a gate terminal and a drain terminal coupled to the output terminal of the integrated circuit.

20. The integrated circuit of claim 15, wherein the resistor is between a ground voltage supply and the second cascode structure.

* * * * *